(12) United States Patent
Zanbaghi et al.

(10) Patent No.: US 11,316,508 B2
(45) Date of Patent: Apr. 26, 2022

(54) DETECTION AND PROTECTION OF SHORT BETWEEN POWER SUPPLIES IN A Y-BRIDGE DRIVER

(71) Applicant: Cirrus Logic International Semiconductor Ltd., Edinburgh (GB)

(72) Inventors: Ramin Zanbaghi, Austin, TX (US); Cory J. Peterson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 121 days.

(21) Appl. No.: 16/820,897

(22) Filed: Mar. 17, 2020

(65) Prior Publication Data

US 2021/0297072 A1    Sep. 23, 2021

(51) Int. Cl.
*H03K 17/081* (2006.01)
*H03K 7/08* (2006.01)
*H04R 3/00* (2006.01)

(52) U.S. Cl.
CPC ......... *H03K 17/08104* (2013.01); *H03K 7/08* (2013.01); *H04R 3/00* (2013.01)

(58) Field of Classification Search
CPC ....... H03K 17/08104; H03K 7/08; H04R 3/00
See application file for complete search history.

(56) References Cited

U.S. PATENT DOCUMENTS

| | | | | |
|---|---|---|---|---|
| 6,130,813 A * | 10/2000 | Kates | ...................... | H02J 1/10 361/93.1 |
| 6,198,259 B1 | 3/2001 | Ueki et al. | | |
| 9,997,992 B1 * | 6/2018 | Wu | ..................... | H02M 3/1588 |
| 2004/0100241 A1 | 5/2004 | Abo | | |
| 2011/0254454 A1 * | 10/2011 | Inoue | ..................... | H05B 45/37 315/161 |

FOREIGN PATENT DOCUMENTS

| | | |
|---|---|---|
| EP | 2910405 A1 | 8/2015 |
| KR | 20170115358 A | 10/2017 |
| WO | 2013102673 A1 | 7/2013 |

OTHER PUBLICATIONS

International Search Report and Written Opinion of the International Searching Authority, International Application No. PCT/US2021/019957, dated Jun. 7, 2021.

* cited by examiner

*Primary Examiner* — Sibin Chen
(74) *Attorney, Agent, or Firm* — Jackson Walker L.L.P.

(57) ABSTRACT

A system may include an output driving stage comprising a first switch configured to selectively open and close an electrical path between a first supply voltage and an output terminal of the output driving stage and a second switch configured to selectively open and close an electrical path between a second supply voltage and the output terminal of the output driving stage, wherein the second supply voltage is lower than the first supply voltage. The system may also include detection and protection circuitry configured to monitor a physical quantity indicative of the second supply voltage and responsive to the physical quantity exceeding an overvoltage threshold, electrically isolate the output terminal from the second supply voltage.

21 Claims, 2 Drawing Sheets

DETECTION AND PROTECTION OF SHORT BETWEEN POWER SUPPLIES IN A Y-BRIDGE DRIVER

FIELD OF DISCLOSURE

The present disclosure relates in general to circuits for audio devices, piezoelectric devices, and/or haptic-feedback devices, including without limitation personal audio devices such as wireless telephones and media players, and more specifically, to detection and protection of electrical shorts between power supplies in a Y-bridge transducer driver.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

Battery-powered systems may use a boost converter to generate a power supply for an audio amplifier that is greater than a voltage of the battery. For example, a motivation of using a boost converter in a battery-powered transducer is to generate a greater signal swing at the output of a transducer amplifier than could be achieved by powering the amplifier directly from the battery. However, power consumption of a transducer driver system is often a concern, particularly in battery-powered devices, and methods and systems are desired to reduce power consumption and extend battery life over that of existing approaches.

One approach that is often employed is use of a Class-G amplifier driver, wherein a voltage supply used by the Class-G amplifier to drive an output signal is selectable based on a magnitude of the output signal to be driven by the amplifier. For example, if the magnitude of the output signal to be driven by the amplifier is below a battery supply voltage, the battery supply voltage may be used by the amplifier. However, if the magnitude of the output signal is above the battery voltage, a higher boosted voltage may be supplied to the amplifier. Such approach may reduce power consumption caused by switching losses for lower magnitudes of the output signal.

However, one potential risk in using two (or more) supply voltages for an amplifier is that the supply voltages may become electrically shorted together. Such electrical shorting may cause electrical current to flow from the higher supply voltage to the lower supply voltage, thus increasing the lower supply voltage, which may lead to damage to components other than the Class-G amplifier which are supplied by the lower supply voltage. Accordingly, approaches to quickly detect and provide protection from such electrical shorts are desired.

SUMMARY

In accordance with the teachings of the present disclosure, one or more disadvantages and problems associated with existing approaches to driving a transducer may be reduced or eliminated.

In accordance with embodiments of the present disclosure, a system may include an output driving stage comprising a first switch configured to selectively open and close an electrical path between a first supply voltage and an output terminal of the output driving stage and a second switch configured to selectively open and close an electrical path between a second supply voltage and the output terminal of the output driving stage, wherein the second supply voltage is lower than the first supply voltage. The system may also include detection and protection circuitry configured to monitor a physical quantity indicative of the second supply voltage and responsive to the physical quantity exceeding an overvoltage threshold, electrically isolate the output terminal from the second supply voltage.

In accordance with these and other embodiments of the present disclosure, a method may include, in an output driving stage comprising a first switch configured to selectively open and close an electrical path between a first supply voltage and an output terminal of the output driving stage and a second switch configured to selectively open and close an electrical path between a second supply voltage and the output terminal of the output driving stage, wherein the second supply voltage is lower than the first supply voltage: monitoring a physical quantity indicative of the second supply voltage and responsive to the physical quantity exceeding an overvoltage threshold, electrically isolating the output terminal from the second supply voltage.

In accordance with these and other embodiments of the present disclosure, a device may include a signal path comprising a signal path input for receiving an input signal, a modulator configured to convert the input signal to a pulse-width-modulated signal, and an output driving stage configured to drive the pulse-width modulated signal to an output, the output driving stage comprising a first switch configured to selectively open and close an electrical path between a first supply voltage and an output terminal of the output driving stage and a second switch configured to selectively open and close an electrical path between a second supply voltage and the output terminal of the output driving stage, wherein the second supply voltage is lower than the first supply voltage. The device may also include detection and protection circuitry configured to monitor a physical quantity indicative of the second supply voltage and responsive to the physical quantity exceeding an overvoltage threshold, electrically isolate the output terminal from the second supply voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
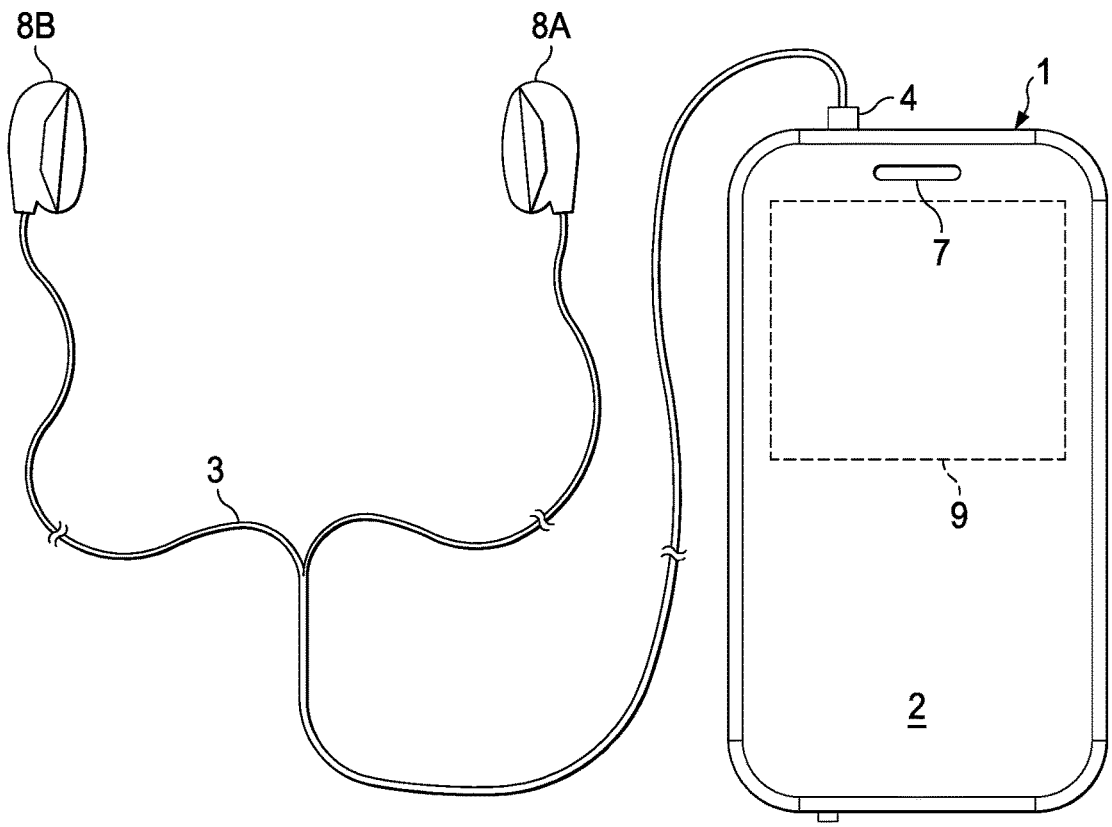
FIG. 1 illustrates an example personal mobile device, in accordance with embodiments of the present disclosure.

FIG. 1 illustrates an example personal mobile device 1, in accordance with embodiments of the present disclosure. FIG. 1 depicts personal mobile device 1 having a speaker 7. Speaker 7 is merely an example, and it is understood that personal mobile device 1 may be used in connection with a variety of transducers including magnetic coil loudspeakers, piezo speakers, haptic feedback transducers, and others. In addition or alternatively, personal mobile device 1 may be coupled to a headset 3 in the form of a pair of earbud speakers 8A and 8B. Headset 3 depicted in FIG. 1 is merely an example, and it is understood that personal mobile device 1 may be used in connection with a variety of audio transducers, including without limitation, headphones, earbuds, in-ear earphones, and external speakers. A plug 4 may provide for connection of headset 3 to an electrical terminal of personal mobile device 1. Personal mobile device 1 may provide a display to a user and receive user input using a touch screen 2, or alternatively, a standard liquid crystal display (LCD) may be combined with various buttons, sliders, and/or dials disposed on the face and/or sides of personal mobile device 1. As also shown in FIG. 1, personal mobile device 1 may include an integrated circuit (IC) 9 for generating an analog signal for transmission to speaker 7, headset 3, and/or another transducer. Although FIG. 1 shows IC 9 configured to drive an audio transducer, the methods and systems disclosed herein may be similarly applied to other types of transducers (e.g., haptic, piezeoeletric).

Figure 2:
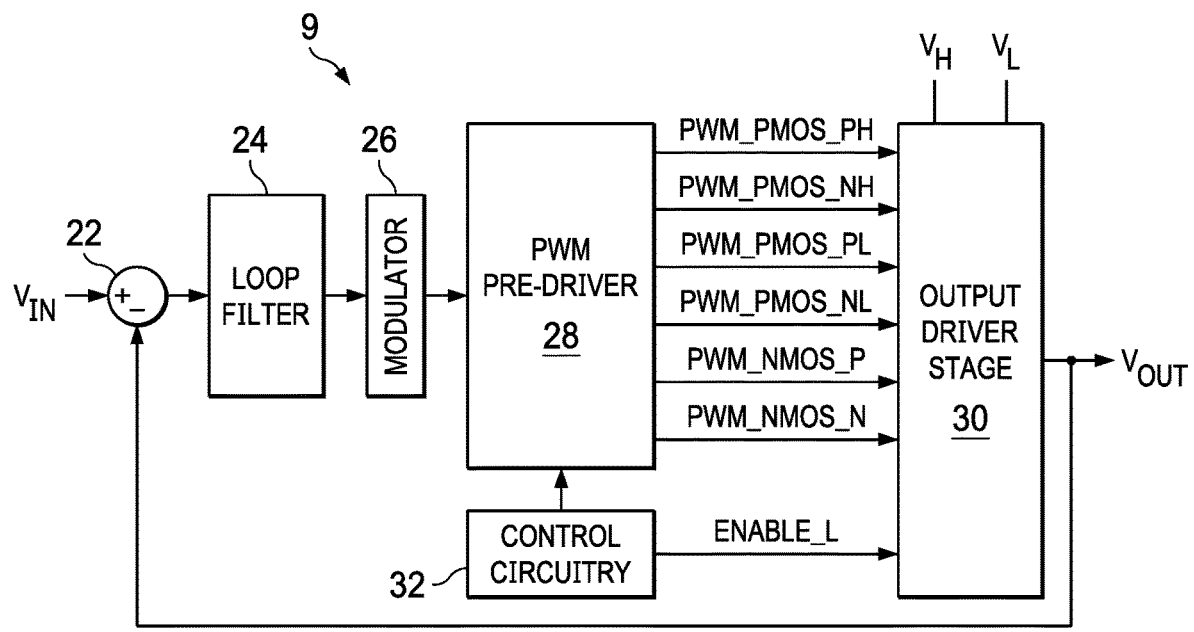
FIG. 2 illustrates a block diagram of selected components of an example integrated circuit of a personal mobile device for driving a transducer, in accordance with embodiments of the present disclosure.

FIG. 2 illustrates a block diagram of selected components of an example IC 9 of a personal mobile device for driving a transducer, in accordance with embodiments of the present disclosure. As shown in FIG. 2, IC 9 may include an input combiner 22, a loop filter 24, a modulator 26, a pulse-width modulation (PWM) predriver 28, an output driver stage 30, and control circuitry 32.

Combiner 22 may comprise any system, device, or apparatus configured to generate an error signal equal to the difference of an input signal $V_{IN}$ and an output signal $V_{OUT}$ driven by output driver stage 30. Input signal $V_{IN}$ and/or output signal $V_{OUT}$ may comprise audio signals, haptic waveform signals, piezoelectrical signals, or signals suitable for any type of transducer. While variable representations "$V_{N}$" and "$V_{OUT}$" may be construed as analog voltages, it is understood that input signal $V_{IN}$ and/or output signal $V_{OUT}$ may be represented by a physical quantity other than voltage (e.g., current).

Loop filter 24 may comprise any system, device, or apparatus configured to receive the error signal from combiner 22 and generate a filtered error signal to be communicated to modulator 26. In some embodiments, loop filter 24 may comprise a proportional-integral-derivative (PID) controller.

Modulator 26 may comprise any system, device, or apparatus configured to quantize a signal (e.g., the filtered error signal generated by loop filter 24) to generate an equivalent digital PWM signal.

PWM pre-driver 28 may comprise any system, device, or apparatus configured to receive a quantized PWM signal (e.g., from modulator 26) and condition such signal for output driver stage 30. Accordingly, PWM pre-driver 28 may comprise a signal buffer and/or other logic elements to provide control of gate terminals of switches of output driver stage 30. For example, PWM pre-driver 28 may generate a plurality of pre-driver signals (e.g., PWM_PMOS_PH, PWM_PMOS_NH, PWM_PMOS_PL, PWM_PMOS_NL, PWM_NMOS_P, and PWM_NMOS_N) for driving gates of transistors of output driver stage 30, as described in greater detail below.

Output driver stage 30 may comprise any system, device, or apparatus configured to receive pre-driver signals (e.g., from PWM pre-driver 28) and drive output signal $V_{OUT}$ to a load (e.g., a transducer load such as an earbud 8A, 8B or speaker 7) based on the pre-driver signals, wherein output signal $V_{OUT}$ tracks input signal $V_{IN}$. As further shown in FIG. 2, output driver stage 30 may be powered from a higher supply voltage $V_H$ or a lower supply voltage $V_L$, wherein selection between higher supply voltage $V_H$ and lower supply voltage $V_L$ is based on a magnitude of output signal $V_{OUT}$ (or a magnitude of a signal indicative of the magnitude of output signal $V_{OUT}$, such as input signal $V_{IN}$). An example implementation of output driver stage 30 is shown in FIG. 3 and described in detail below.

Control circuitry 32 may comprise any system, device, or apparatus configured to receive a signal (e.g., input signal $V_{IN}$) indicative of the magnitude of output signal $V_{OUT}$, and based on such magnitude, control operation of PWM pre-driver 28 and/or output driver stage 30. For example, based on such magnitude, control circuitry 32 may generate a control signal ENABLE_L that selects from higher supply voltage $V_H$ and lower supply voltage $V_L$ for use by output diver stage 30. As another example, control circuitry 32 may cause further conditioning of pre-driver signals generated by PWM pre-driver 28 (e.g., selectively cause assertion or deassertion of some of such pre-driver signals) based on the magnitude of output signal $V_{OUT}$, as described in greater detail below.

Although FIGS. 1 and 2 contemplate that IC 9 resides in a personal mobile device, systems and methods described herein may also be applied to electrical and electronic systems and devices other than a personal mobile device, including transducer systems for use in a computing device larger than a personal mobile device, an automobile, a building, or other structure.

Figure 3:
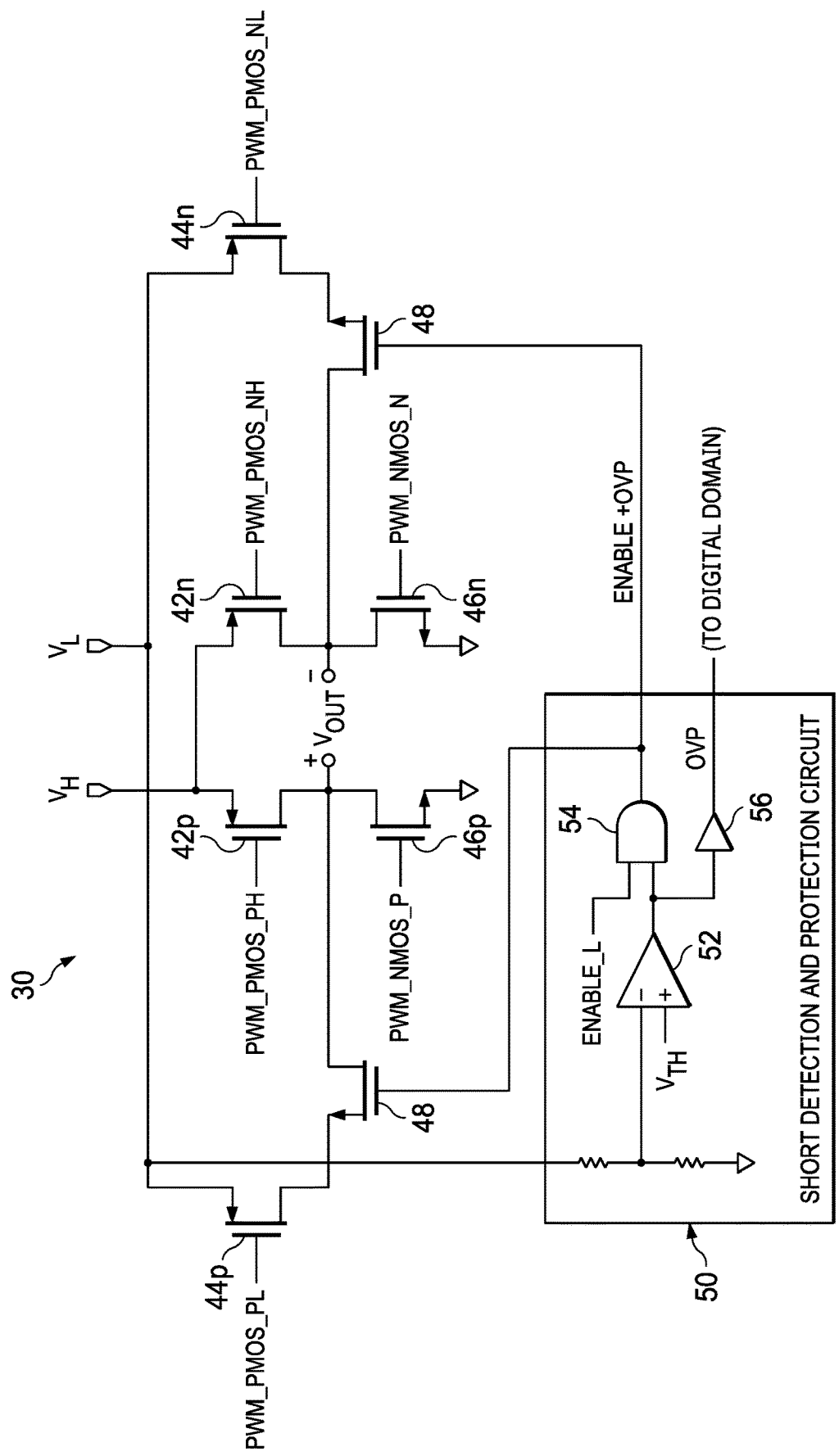
FIG. 3 illustrates a circuit diagram of selected components of an example output driver stage, in accordance with embodiments of the present disclosure.

FIG. 3 illustrates a circuit diagram of selected components of an example output driver stage 30, in accordance with embodiments of the present disclosure. As shown in FIG. 3, output driver stage 30 may comprise a plurality of output switches 42, 44, and 46 configured in a combination Y-bridge and H-bridge configuration to generate output signal $V_{OUT}$ from modulated signals generated by PWM pre-driver 28. To illustrate, switches 42p, 44p, and 46p may drive a positive output terminal of output driver stage 30 while switches 42n, 44n, and 46n may drive a negative output terminal. When a magnitude of output signal $V_{OUT}$ is above an output threshold level (e.g., lower supply voltage $V_L$ minus a headroom), control circuit 32 may deassert control signal ENABLE_L to open (e.g., deactivate, turn off, disable) isolation switches 48 and PWM pre-driver 28 may appropriately drive pre-driver signals PWM_MOS_PH, PWM_PMOS_NH, PWM_NMOS_P, and PWM_NMOS_N (and in some embodiments, set pre-driver signals PWM_P-MOS_PL and PWM_PMOS_NL to "high" or logic 1) to commutate switches 42p, 42n, 46p, and 46n respectively to generate a desired output signal $V_{OUT}$ as a function of input signal $V_{IN}$. On the other hand, when the magnitude of output signal $V_{OUT}$ is below the output threshold level (e.g., lower supply voltage $V_L$ minus a headroom), control circuit 32 may (assuming no electrical short is detected) assert control signal ENABLE_L to close (e.g., activate, turn on, enable) isolation switches 48 and PWM pre-driver 28 may appropriately drive pre-driver signals PWM_MOS_PL, PWM_P-MOS_NL, PWM_NMOS_P, and PWM_NMOS_N (and in some embodiments, set pre-driver signals PWM_P-MOS_PH and PWM_PMOS_NH to "high" or logic 1) to commutate switches 44p, 44n, 46p, and 46n respectively to generate a desired output signal $V_{OUT}$ as a function of input signal $V_{IN}$.

In some instances, it may be possible, due to fabrication defects or other unintended consequence, that higher supply voltage $V_H$ may electrically short to one or both of the output terminals of output driver stage 30. In such case, if a switch 44 and isolation switch 48 are closed (e.g., due to operation using lower supply voltage $V_L$), such higher supply voltage $V_H$ may also electrically short to lower supply voltage $V_L$, potentially causing an overvoltage condition on lower supply voltage $V_L$ that could potentially damage other components powered from lower supply voltage $V_L$.

Accordingly, a short detection and protection circuit 50 may be employed to detect the existence of such an electrical short between higher supply voltage $V_H$ and one or both of the output terminals of output driver stage 30, and then protect lower supply voltage $V_L$ from an overvoltage condition caused by such electrical short. As shown in FIG. 3, short detection and protection circuit 50 may compare (e.g., with comparator 52) a voltage indicative of lower supply voltage $V_L$ (e.g., lower supply voltage $V_L$ or a scaled version thereof) to an overvoltage threshold $V_{TH}$, and generate a signal based on such comparison such that if lower supply voltage $V_L$ exceeds overvoltage threshold $V_{TH}$, comparator 52 may cause (e.g., by way of a logical AND 54 with control signal ENABLE_L) isolation switches 48 to open, thus isolating the domain of lower supply voltage $V_L$ from the output terminals of output driver stage 30, and thus isolating lower supply voltage $V_L$ from higher supply voltage $V_H$ to protect other components supplied from lower supply voltage $V_L$. In some embodiments, comparator 52 may comprise a hysteretic comparator.

Also as shown in FIG. 3, the output of comparator 52 may be buffered (e.g., by buffer 56) and communicated as a digital output signal (e.g., to other control circuitry), such that an alert or other action based on the electrical short between higher supply voltage $V_H$ and the output terminal(s) of output driver stage 30 may be made or taken.

Although short detection and protection circuit 50 is shown as integral to output driver stage 30, in some embodiments short detection and protection circuit 50 may not be a part of output driver stage 30. In some of such embodiments, short detection and protection circuit 50 may instead be integral to control circuit 32.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:
1. A system comprising:
a Y-bridge transducer driver comprising:

a first switch configured to selectively open and close an electrical path between a first supply voltage and an output terminal of the output driving stage; and a second switch configured to selectively open and close an electrical path between a second supply voltage and the output terminal of the output driving stage, wherein the second supply voltage is lower than the first supply voltage; and detection and protection circuitry configured to:
monitor a physical quantity indicative of the second supply voltage; and
responsive to the physical quantity exceeding an overvoltage threshold, electrically isolate the output terminal from the second supply voltage.

2. The system of claim 1, wherein the physical quantity exceeding the overvoltage threshold is indicative of an electrical short between the first supply voltage and the output terminal occurring regardless of whether the first switch has opened or closed the electrical path between the first supply voltage and the output terminal.

3. The system of claim 1, wherein isolating the output terminal from the second supply voltage comprises causing an isolation switch in series with the second switch to open the electrical path between the second supply voltage and the output terminal of the Y-bridge transducer driver.

4. The system of claim 1, wherein the detection and protection circuitry comprises a comparator configured to compare the physical quantity to the overvoltage threshold.

5. The system of claim 4, wherein the comparator comprises a hysteretic comparator.

6. The system of claim 1, wherein the physical quantity is the second supply voltage.

7. The system of claim 1, wherein the physical quantity is a scaled version of the second supply voltage.

8. A method comprising, in a Y-bridge transducer driver comprising a first switch configured to selectively open and close an electrical path between a first supply voltage and an output terminal of the output driving stage and a second switch configured to selectively open and close an electrical path between a second supply voltage and the output terminal of the output driving stage, wherein the second supply voltage is lower than the first supply voltage:

monitoring a physical quantity indicative of the second supply voltage; and
responsive to the physical quantity exceeding an overvoltage threshold, electrically isolating the output terminal from the second supply voltage.

9. The method of claim 8, wherein the physical quantity exceeding the overvoltage threshold is indicative of an electrical short between the first supply voltage and the output terminal occurring regardless of whether the first switch has opened or closed the electrical path between the first supply voltage and the output terminal.

10. The method of claim 8, wherein isolating the output terminal from the second supply voltage comprises causing an isolation switch in series with the second switch to open the electrical path between the second supply voltage and the output terminal of the Y-bridge transducer driver.

11. The method of claim 8, further comprising comparing, with a comparator, the physical quantity to the overvoltage threshold.

12. The method of claim 11, wherein the comparator comprises a hysteretic comparator.

13. The method of claim 8, wherein the physical quantity is the second supply voltage.

14. The method of claim 8, wherein the physical quantity is a scaled version of the second supply voltage.

15. A device comprising:
a signal path comprising:
a signal path input for receiving an input signal;
a modulator configured to convert the input signal to a pulse-width-modulated signal; and
a Y-bridge transducer driver configured to drive the pulse-width modulated signal to an output, the Y-bridge transducer driver comprising:
a first switch configured to selectively open and close an electrical path between a first supply voltage and an output terminal of the Y-bridge transducer driver; and
a second switch configured to selectively open and close an electrical path between a second supply voltage and the output terminal of the Y-bridge transducer driver, wherein the second supply voltage is lower than the first supply voltage; and
detection and protection circuitry configured to:
monitor a physical quantity indicative of the second supply voltage; and
responsive to the physical quantity exceeding an overvoltage threshold, electrically isolate the output terminal from the second supply voltage.

16. The device of claim 15, wherein the physical quantity exceeding the overvoltage threshold is indicative of an electrical short between the first supply voltage and the output terminal occurring regardless of whether the first switch has opened or closed the electrical path between the first supply voltage and the output terminal.

17. The device of claim 15, wherein isolating the output terminal from the second supply voltage comprises causing an isolation switch in series with the second switch to open the electrical path between the second supply voltage and the output terminal of the Y-bridge transducer driver.

18. The device of claim 15, wherein the detection and protection circuitry comprises a comparator configured to compare the physical quantity to the overvoltage threshold.

19. The device of claim 18, wherein the comparator comprises a hysteretic comparator.

20. The device of claim 15, wherein the physical quantity is the second supply voltage.

21. The device of claim 15, wherein the physical quantity is a scaled version of the second supply voltage.

* * * * *